(12) United States Patent
Sharp et al.

(10) Patent No.: US 6,506,111 B2
(45) Date of Patent: Jan. 14, 2003

(54) COOLING AIRFLOW DISTRIBUTION DEVICE

(75) Inventors: Anthony C. Sharp, Scarborough (CA); Andrew Hudz, Etobicoke (CA); Peter Jeffery, West Hill (CA)

(73) Assignee: Sanmina-SCI Corporation, San Jose, CA (US)

( * ) Notice: Subject to any disclaimer, the term of this patent is extended or adjusted under 35 U.S.C. 154(b) by 0 days.

(21) Appl. No.: 09/927,659

(22) Filed: Aug. 10, 2001

(65) Prior Publication Data

US 2002/0173266 A1 Nov. 21, 2002

Related U.S. Application Data

(60) Provisional application No. 60/291,447, filed on May 16, 2001.

(51) Int. Cl.[7] .................................................. H05K 5/00
(52) U.S. Cl. ........................ 454/184; 361/695; 165/122
(58) Field of Search .......................... 454/184, 185, 454/195; 361/695, 696; 165/122, 80.2, 104.33, 104.34; 312/236

(56) References Cited

U.S. PATENT DOCUMENTS

| | | | |
|---|---|---|---|
| 3,120,166 A | * | 2/1964 | Lyman ........................ 454/184 |
| 4,089,040 A | | 5/1978 | Paulsen |
| 4,196,526 A | | 4/1980 | Berti |
| 4,315,300 A | | 2/1982 | Parmerlee et al. |
| 4,352,274 A | | 10/1982 | Anderson et al. |
| 4,672,509 A | | 6/1987 | Speraw |
| 4,851,965 A | | 7/1989 | Gabuzda et al. |
| 4,860,163 A | | 8/1989 | Sarath |
| 5,150,277 A | | 9/1992 | Bainbridge et al. |
| 5,285,347 A | | 2/1994 | Fox et al. |
| 5,329,425 A | | 7/1994 | Leyssens et al. |
| 5,460,441 A | * | 10/1995 | Hastings et al. ......... 312/138.1 |
| 5,467,607 A | | 11/1995 | Harvey |
| 5,509,468 A | | 4/1996 | Lopez |
| 5,544,012 A | | 8/1996 | Koike |
| 5,671,805 A | | 9/1997 | Stahl et al. |
| 5,765,743 A | | 6/1998 | Sakiura et al. |
| 5,823,005 A | | 10/1998 | Alexander et al. |
| 5,826,432 A | | 10/1998 | Ledbetter |
| 5,851,143 A | * | 12/1998 | Hamid ..................... 312/223.6 |
| 5,953,930 A | | 9/1999 | Chu et al. |
| 5,982,616 A | | 11/1999 | Moore |
| 6,088,225 A | * | 7/2000 | Parry et al. ............ 165/104.33 |
| 6,127,663 A | | 10/2000 | Jones |
| 6,164,369 A | * | 12/2000 | Stoller ................... 165/104.33 |
| 6,186,890 B1 | * | 2/2001 | French et al. ............... 361/695 |
| 6,198,628 B1 | * | 3/2002 | Smith ......................... 361/695 |

FOREIGN PATENT DOCUMENTS

WO    WO01/62060    9/2001

* cited by examiner

Primary Examiner—Derek Boles
(74) Attorney, Agent, or Firm—McDermott, Will & Emery

(57) ABSTRACT

A system for removing heat from a plurality of electronic assemblies including a cabinet having brackets for supporting electronic assemblies in a vertical array between a first vertical airflow path and a second vertical air flow path of the cabinet, and a plinth underlying the cabinet and having an input port receiving air from the first vertical airflow path of the cabinet, an output port transmitting air to the second vertical air flow path, a heat exchanger positioned in an air flow path extending between the input and the output ports, and a fan assembly for driving air through the heat exchanger and towards the input port. The system further includes at least one air flow distribution device establishing a predetermined flow rate distribution through electronic assemblies supported by the brackets.

25 Claims, 4 Drawing Sheets

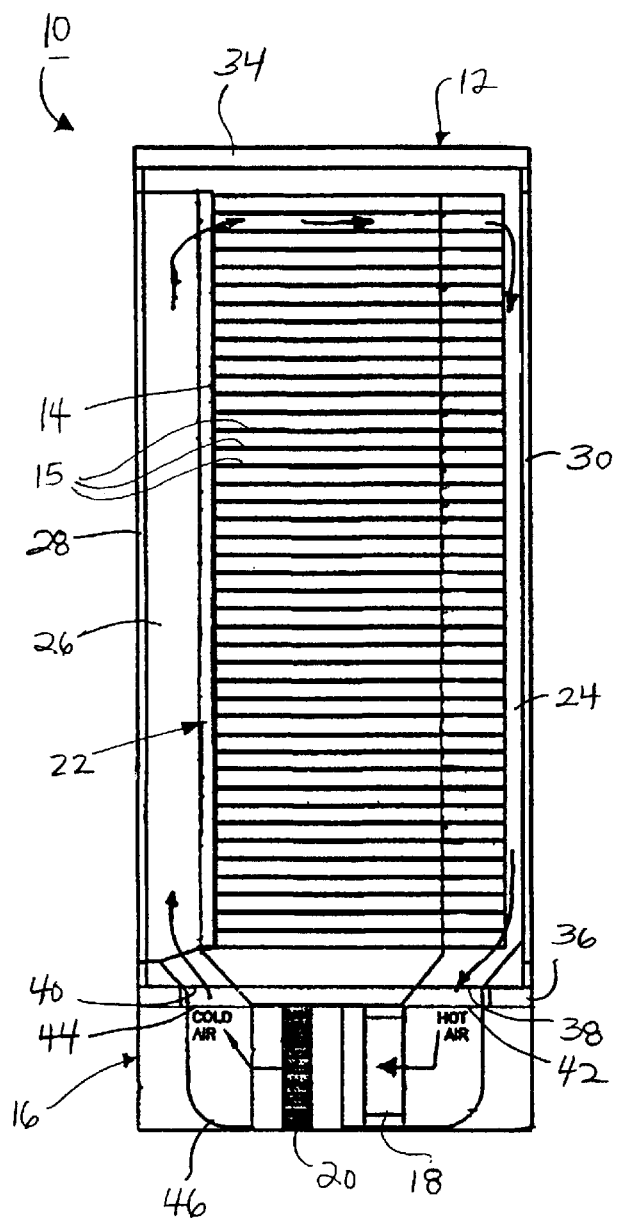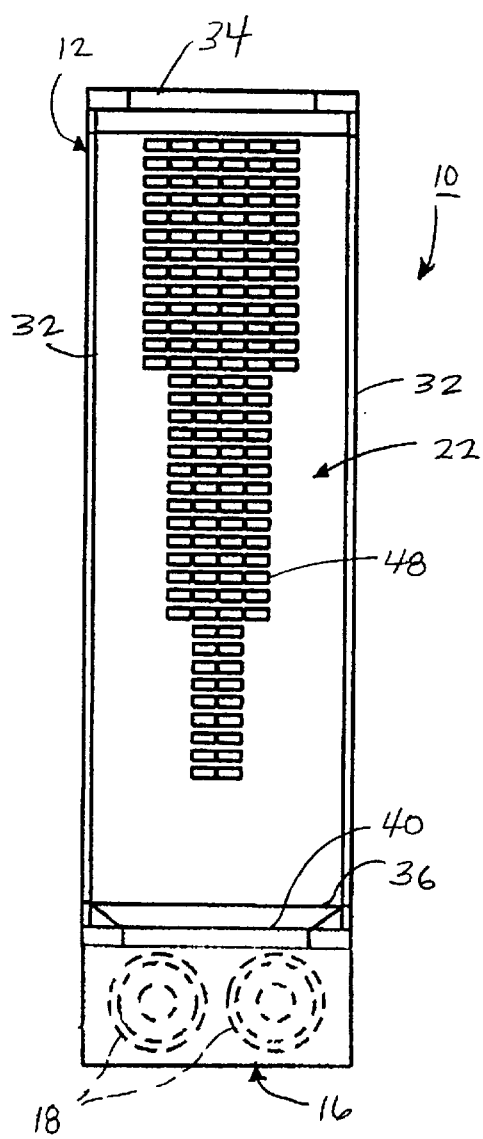
FIG. 1
FIG. 2

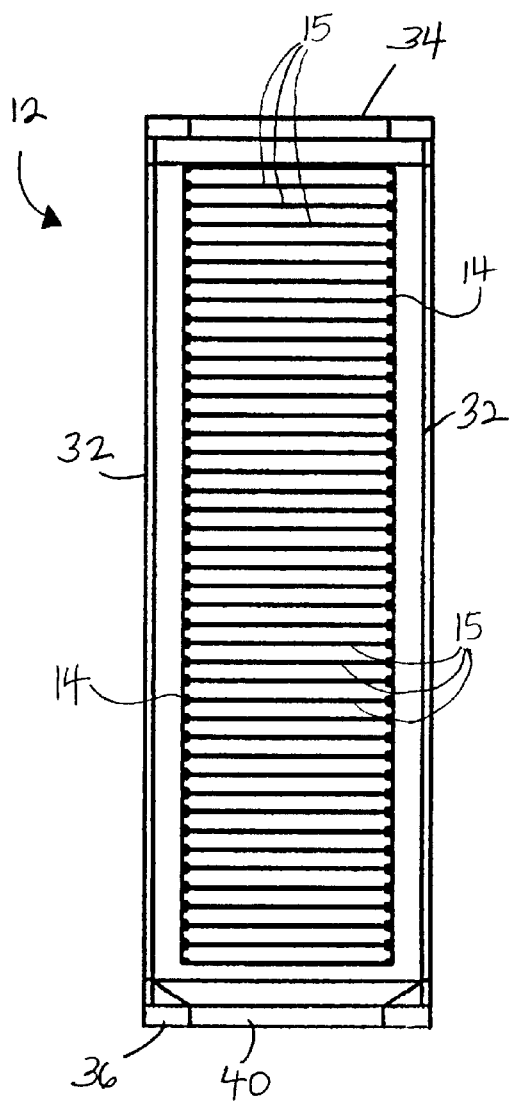
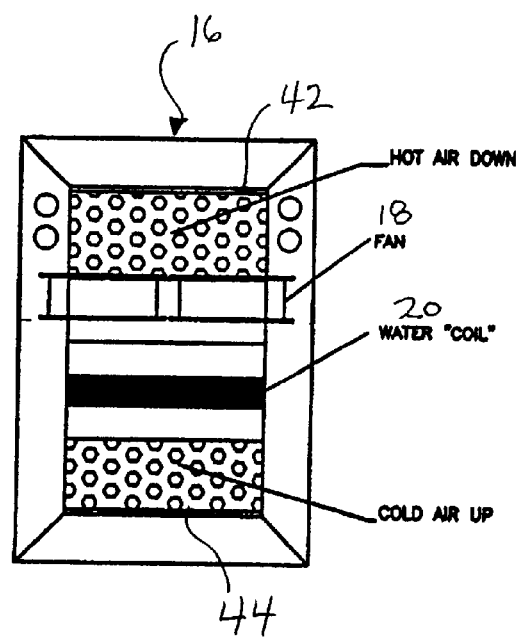
FIG. 3
FIG. 4

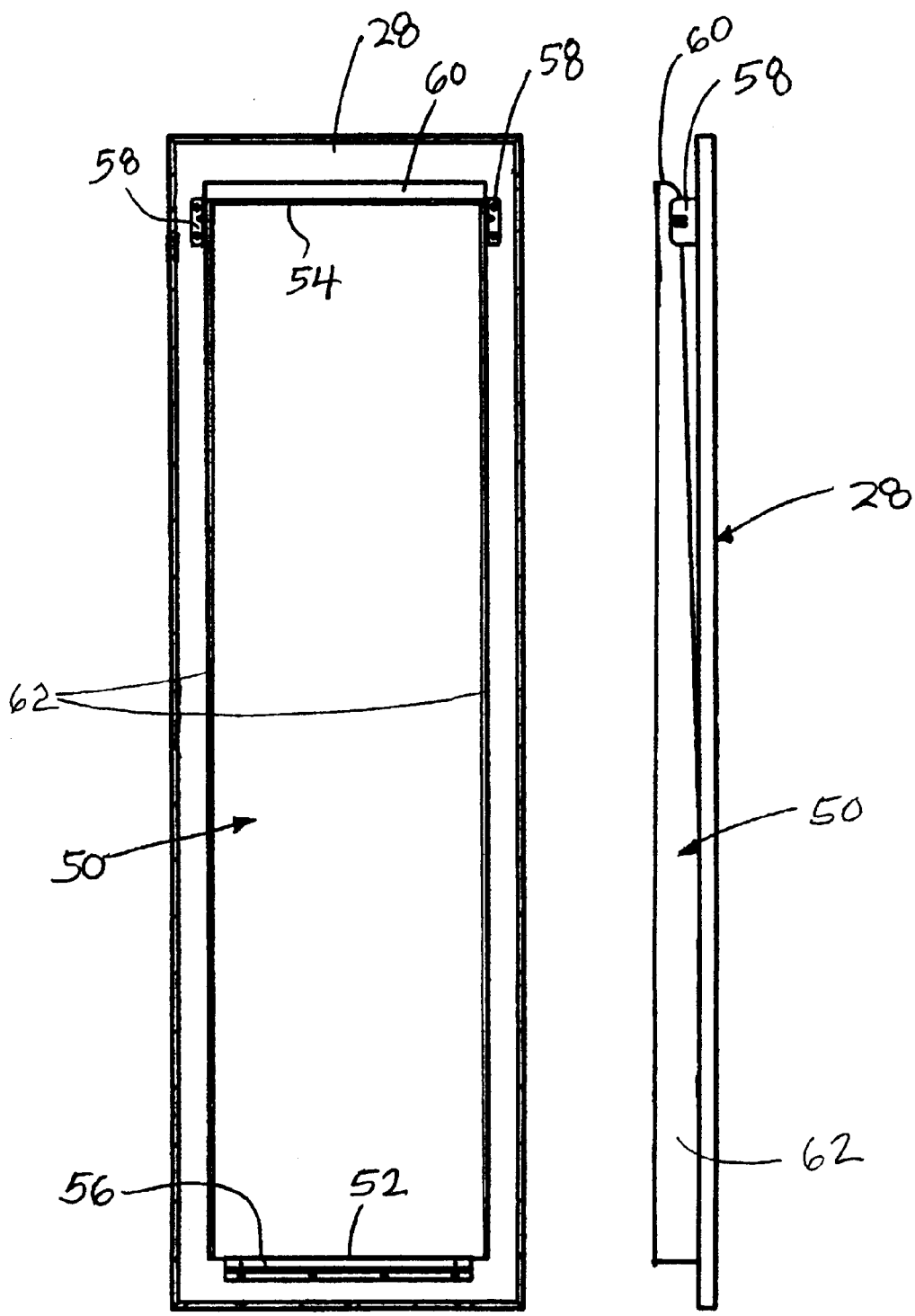
FIG. 8  FIG. 9

COOLING AIRFLOW DISTRIBUTION DEVICE

CROSS-REFERENCE TO RELATED APPLICATION

The present application claims priority to provisional U.S. patent application Ser. No. 60/291,447, filed May 16, 2001, the disclosure of which is incorporated herein by reference in its entirety.

FIELD OF THE INVENTION

This invention relates to a method and system for removing heat from electronic data servers or similar equipment and, more particularly, to a system having a closed cabinet for supporting electronic assemblies, a plinth for providing a cooling airflow to the interior of the cabinet, and distribution devices for distributing the cooling airflow within the cabinet.

BACKGROUND OF THE INVENTION

The advent of "high-density electronic data servers" has led to the mounting of as many as forty-two (42) servers in one cabinet, typically seven (7) feet high. This in turn has greatly increased the total heat load in such cabinets, reaching as high as ten (10) kilowatts, with attendant problems of maintaining acceptable working temperatures inside the cabinet. Without acceptable working temperatures, the life and reliability of the servers are reduced. Since these servers commonly handle large amounts of sensitive and valuable data, uncontrolled working temperatures are not acceptable, and steps to maintain the servers at a relatively cool and steady temperature are required.

One method of cooling server cabinets is to install the cabinets in rooms that are air conditioned and/or supplied with ducted, cooled air. There are, however, several disadvantages to this method. To begin with, energy is wasted since the whole room and the contents of the room must be cooled. In addition, because the cabinets are mounted in rows, the heated air which exits one row of cabinets adversely affects the temperature of adjacent rows of cabinets. Furthermore, upgrading existing installations by the addition of cabinets filled with high density servers may not be possible since the cooling capacity of existing room air-conditioning units may be exceeded. Also, with the shortages of available electrical power, the demand of new room air-conditioner systems may not be met by the public utility. Finally, floor-standing heat management units are sometimes provided in such rooms for cooling the air delivered to the cabinets. Such units, however, occupy valuable floor area that could be more profitably occupied by a server cabinet.

What is still desired, therefore, is a new and improved system for removing heat from a plurality of electronic assemblies, such as data servers. Such a system will preferably use available power more efficiently to cool the electronic devices. In particular, such a system will preferably cool only the interior portions of the cabinet, as opposed to entire rooms. In addition, such a system will preferably cool the interior portions of the cabinet independently of adjacent server cabinets or rows of server cabinets. Furthermore, such a system will preferably utilize floor area more efficiently, and more easily accommodate the upgrading of existing installations by the addition of server cabinets.

SUMMARY OF THE INVENTION

In response, the present invention provides a new and improved system for removing heat from a plurality of electronic assemblies, such as data servers. The system includes at least one cabinet having brackets-for supporting electronic assemblies in a vertical array between a first vertical airflow path and a second vertical air flow path of the cabinet.

The system also includes at least one plinth underlying the cabinet and having an input port receiving air from the first vertical airflow path of the cabinet, an output port transmitting air from the plinth to the second vertical air flow path of the cabinet, and a plinth air flow path extending between the input and the output ports. At least one heat exchanger is positioned in the plinth air flow path for transferring heat to a heat exchange medium passing through the heat exchanger, and at least one fan assembly is disposed along the plinth air flow path for driving air through the heat exchanger.

The system further includes at least one air flow distribution device establishing a predetermined flow rate distribution through electronic assemblies supported by the brackets. The air flow distribution device ensures that vertically arrayed electronic devices supported in the cabinet receive a predetermined portion of cooling airflow (e.g., equal) from the plinth.

According to one aspect of the invention, the distribution device is adapted such that the predetermined flow rate distribution is substantially the same (such that each vertically arrayed electronic device receives an equal portion of cooling airflow).

According to another aspect, the distribution device is positioned between the second air flow path of the cabinet and the brackets. According to an additional aspect, the distribution device is substantially planar and extends vertically, and includes a plurality of apertures in a predetermined pattern of sizes and positions. According to a further aspect, the apertures of the distribution device are equally sized and provided in horizontal rows corresponding to the brackets, and the horizontal rows closest to the plinth include fewer apertures than the horizontal rows furthest from the plinth.

The present invention provides another air flow distribution device for establishing a predetermined flow rate distribution through electronic devices supported within the cabinet. This device is positioned in one of the airflow paths of the cabinet and extends vertically and laterally between a lower end nearer the plinth and an upper end further from the plinth, such that the upper end of the distribution device is closer to the brackets than the lower end.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 1 is a side sectional view of a new and improved system for removing heat from a plurality of electronic assemblies, such as data servers, constructed in accordance with the present invention and including a cabinet mounted on top of a cooler plinth;

FIG. 2 is a front elevation view of the system of FIG. 1 with a front panel of the cabinet removed to reveal an air flow distribution device of the cabinet;

FIG. 3 is a front elevation view of the cabinet of the system of FIG. 1 removed from the plinth, with a front panel and the air flow distribution device of the cabinet also removed to reveal a vertical array of server brackets of the cabinet;

FIG. 4 is a top plan view of the cooler plinth of the system of FIG. 1;

FIG. 8 is a rear elevation view of the front panel and the air flow distribution device of FIG. 5; and FIG. 9 is a side elevation view of the front panel and the air flow distribution device of FIG. 5.

Like reference characters designate identical or corresponding components and units throughout the several views.

DETAILED DESCRIPTION OF THE INVENTION

Figures 5, 6, 7:
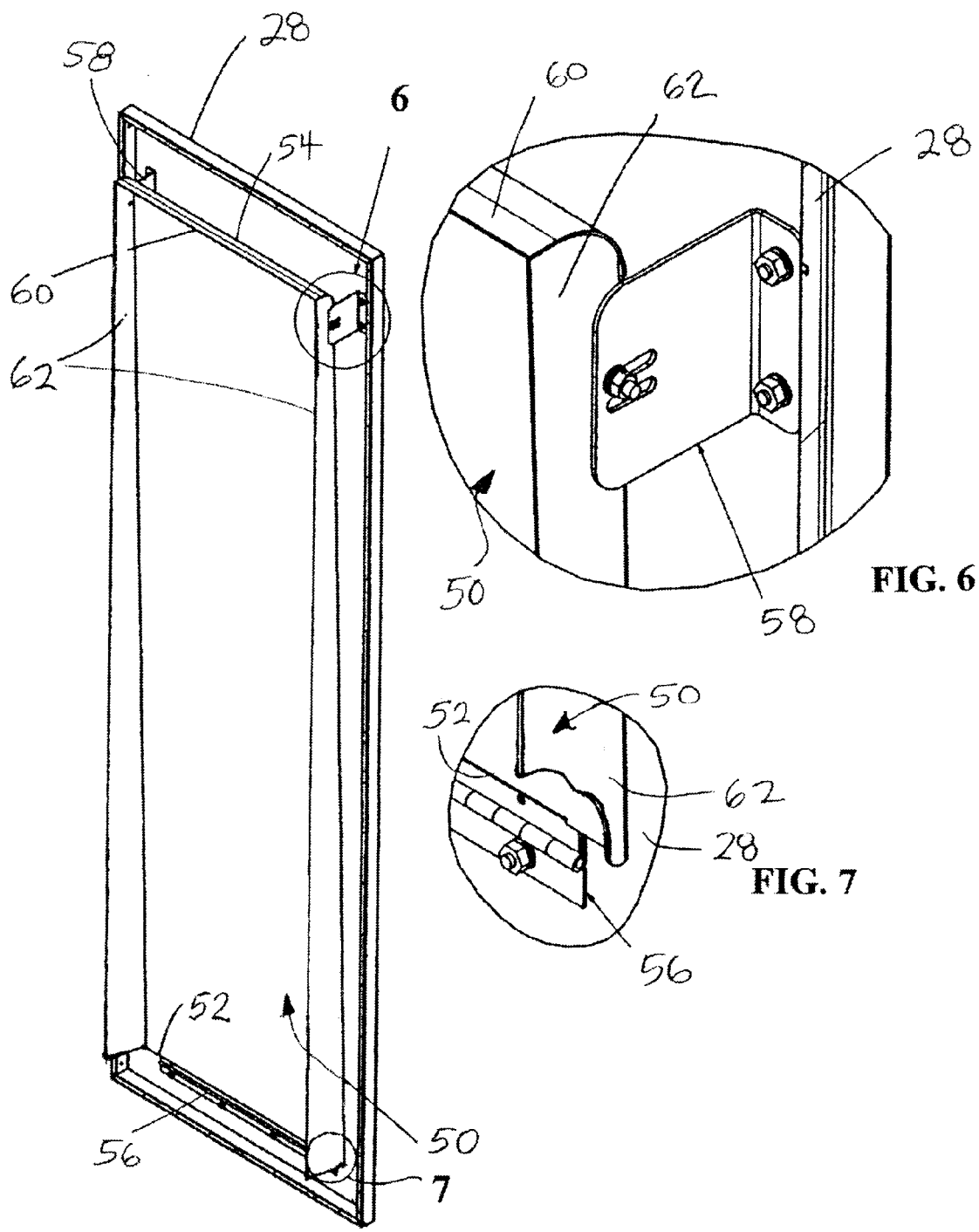
FIG. 5 is a rear perspective view of another front panel for use with the cabinet as shown in FIG. 3, wherein another air flow distribution device constructed in accordance with the present disclosure is attached to the front panel.
FIG. 6 is an enlarged view of the portion of the front panel and the air flow distribution device contained in circle 6 of FIG. 5.
FIG. 7 is an enlarged view of the portion of the front panel and the air flow distribution device contained in circle 7 of FIG. 5, with a portion of the air flow distribution cut-away.

Referring to FIGS. 1 through 4, the present disclosure provides a new and improved system 10 for removing heat from a plurality of electronic assemblies, such as data servers. The system 10 includes at least one cabinet 12 containing means 14 for supporting electronic assemblies such as data servers, at least one plinth 16 containing means 18 for creating an airflow through the cabinet 12 and means 20 for removing heat from the airflow, and at least one air flow distribution device 22 for establishing a predetermined flow rate distribution through the cabinet 12.

Typical applications for the presently disclosed system 10 are found in "data centers" that contain hundreds of cabinets containing "servers" or other electronic data equipment. The equipment may, for example, be used for telecommunication purposes or for high speed internet or streaming data services. In the embodiment shown, the means for supporting the electronic assemblies comprise brackets 14 arranged to support the assemblies in a vertical array and wherein housings of the electronic assemblies will create separate horizontal passages in the vertical array. For purposes of illustration, the server housings are represented by horizontal lines 15 extending between the brackets 14. The "brackets" 14 generally comprise vertical metal strips that have spaced-apart mounting holes for the servers, etc. The servers normally are equipped with mounting brackets at or near their front faces which are fastened to the "brackets" 14 with screws. The means 14 for supporting the electronic assemblies in a vertical array can alternatively comprise shelves or other suitable hardware.

Referring first to FIGS. 1 through 3, the cabinet 12 of the present disclosure includes the brackets 14 for supporting electronic assemblies in the vertical array 15 between a first vertical airflow path 24 and a second vertical air flow path 26 of the cabinet. The cabinet 12 is enclosed about the brackets 14 and the vertical airflow paths 24, 26 and includes front and rear panels 28, 30, side panels 32, and a top panel 34. The front and rear panels 28, 30 can be attached to the cabinet 12 with hinges to act as doors and provide access to electronic components supported on the brackets 14. A base 36 of the cabinet 12 defines an outlet 38 for the first vertical airflow path 24 and an inlet 40 for the second vertical airflow path 26.. Other than the inlet 40 and the outlet 38 defined by the base 36, the cabinet 12 is closed such that the airflow through the cabinet is recirculated.

Referring to FIGS. 1, 2 and 4, the plinth 16 underlying the cabinet 12 has an input port 42 receiving air from the outlet 38 of the first vertical airflow path 24 of the cabinet, an output port 44 transmitting air from the plinth to the inlet 40 of the second vertical air flow path 26 of the cabinet, and a plinth air flow path 46 extending between the input and the output ports. At least one heat exchanger 20 is positioned in the plinth air flow path 46 for transferring heat to a heat exchange medium passing through the heat exchanger 20, and at least one fan assembly 18 is disposed along the plinth air flow path 46 for driving air through the heat exchanger 20 and the cabinet 12. The heat exchanger 20 preferably comprises coils that receive liquid coolant for circulation from a remote source. Heat from the airflow received from the cabinet 12 is absorbed by coolant in the coils 20. Preferably, the coolant comprises cool water.

To achieve the high reliability desired for the system 10, redundancy of essential operating components is preferably employed. Thus, multiple fans 18 are used, so that failure of one fan does not cause total failure of the system 10. Similarly, the heat exchanger 20 preferably comprises multiple chilling coils. Furthermore, the fans 18 and the heat exchanger 20 are constructed and mounted in such a way as to facilitate rapid withdrawal and replacement, for instance on sliding drawers. Remote signaling of alarm conditions, such as fan failure, or high temperature conditions, will facilitate prompt attention by maintenance staff, thus improving overall reliability. To further enhance the rapid servicing of the essential operating components, quick-disconnect means may be employed, for instance the water connections may be made by means of the well-known "double-shutoff" hydraulic hose couplers, and the electrical connections by shrouded plugs and sockets.

In one embodiment of the present disclosure, the plinth 16 can be sized to support multiple cabinets 12. In another embodiment, the plinth 16 may contain one chilling coil 20 for each cabinet 12 mounted on the plinth, one for two or more cabinets, or one for all cabinets mounted upon the plinth. In an alternative embodiment, the plinth 16 may contain one fan 18, or several fans for the movement of air. In a further embodiment, multiple plinths 16 may be used to support and cool a single cabinet 12. In yet another embodiment, side-by-side cabinets 12 and plinths 16 may be bolted together to provide greater resistance to seismic activity. Many combinations and arrangements are possible without departing from the scope of the present invention.

In any event, the modular arrangement of the plinth 16 and the cabinet 12 makes the system 10 versatile and provides improved energy efficiency in comparison to cooling an entire room full of cabinets. The present system 10, thus, reduces running costs and enables larger installations with a given power availability. In addition, by placing the heat removal means in close conjunction with the servers, a better control of the heat removal may be achieved, and, since the temperature may be better regulated, the life and reliability of the servers may be enhanced.

Because the plinth 16 has substantially the same "footprint" dimensions as the cabinet 12, valuable floor area within a server room or installation is made available. Also, by keeping the water-containing parts of the system 10 in the plinth 16, beneath the cabinet 12, the effects of any coolant leak are greatly minimized. Finally, since the specific heat of water and the density of water (or other suitable liquid coolant) are much higher than air, water is a much better medium for moving heat from the cabinet 12, as compared to just air.

Referring to FIGS. 1 and 2, the air flow distribution device 22 of the system 10 is for establishing a predetermined flow rate distribution through various electronic assemblies supported by the brackets 14. In the embodiment shown, the device 22 is configured such that the predetermined flow rate distribution is substantially the same. In other words, the device 22 apportions cooling airflow from the second airflow path 26 of the cabinet 12 approximately equally amongst electronic assemblies supported by the brackets 14, so that each data server held therein is cooled by the same amount of air. However, it should be understood that the device 22 can be configured such that the predetermined flow rate distribution varies, to accommodate different types or sizes of data servers (which might provide different heat loads) for example.

As shown, the distribution device 22 is positioned between the second air flow path 26 of the cabinet 12 and the brackets 14. However, the distribution device 22 can alternatively be positioned between the brackets 14 and the first airflow path 24 of the cabinet. In addition, the cabinet 12 can be provided with two of the distribution devices 22, one positioned between the second air flow path 26 of the cabinet and the brackets 14 and the other positioned between the brackets and the first airflow path 24 of the cabinet.

The distribution device 22 is substantially planar and extends vertically, and includes a plurality of apertures 48 in a predetermined pattern of sizes and positions. As shown in FIG. 2, the apertures 48 of the distribution device 22 at different distances from the plinth 16 are sized and positioned to apportion airflow from the second airflow path 26 of the cabinet approximately equally amongst the brackets 14. In particular, the apertures 48 are equally sized and provided in horizontal rows corresponding to the brackets 14, and the horizontal rows closest to the plinth 16 include fewer apertures 48 than the horizontal rows furthest from the plinth (if appropriate to the desired flow rate distribution, however, the horizontal rows closest to the plinth 16 can be provided with more apertures 48 than the horizontal rows furthest from the plinth).

The distribution device 22 can alternatively be provided with a plurality of apertures, wherein the apertures are provided in horizontal rows, each row includes the same number of apertures, but the sizes of the apertures increase further from the plinth 16 (if appropriate to the desired flow rate distribution, however, the sizes of the apertures can be provided as decreasing further from the plinth 16). The distribution device 22 can alternatively be provided with aperture in horizontal rows, wherein the numbers of apertures in each row and the sizes of the apertures both increase further from the plinth 16 (if appropriate to the desired flow rate distribution, however, the numbers of apertures in each row and the sizes of the apertures can both be provided as decreasing further from the plinth 16).

Thus, the predetermined pattern of sizes and positions of the apertures can be varied to provide a desired flow rate distribution without departing from the scope of the present invention. Although not shown, the apertures 48 can also be provided with louvers to help direct airflow from the vertical airflow path 29 in a horizontal direction through electronic devices supported by the brackets 14.

Referring now to FIGS. 5 through 9, another air flow distribution device 50 constructed in accordance with the present invention is shown. This distribution device 50 is for use with the system 10 of FIG. 1 in place of the distribution device 22 of FIG. 1. When assembled to the cabinet 12, the distribution device 50 of FIG. 5 extends vertically and laterally within the second airflow path 26 between a lower end 52 nearer the plinth 16 and an upper end 54 further from the plinth 16, such that the upper end 54 of the distribution device is closer to the brackets 14 than the lower end 52. In the embodiment shown, the device 50 is substantially planar. In this manner, the device 50 reduces the cross-sectional area of the second air flow path 26 further from the plinth 16, to apportion airflow from the second airflow path 26 of the cabinet 12 approximately equally amongst electronic devices supported by the brackets 14.

It should be understood, that the device 50 can be configured to be curved, or otherwise formed, instead of planar, so as provide a varied airflow distribution. In addition, the device 50 can be positioned in the first airflow path 24 of the cabinet 12 instead of the second airflow path 26. Furthermore, the cabinet 12 can be provided with two of the distribution devices 50, one positioned in the second air flow path 26 and the other positioned in the first airflow path 24 of the cabinet.

In the embodiment of FIGS. 5 through 9, the distribution device 50 is mounted to the inside of the front panel 28 of the cabinet 28. As shown, the lower end 52 is secured to the panel 28 with a hinged assembly 56, while the upper end 54 is adjustably secured to the panel with brackets 58, such that the position of the upper end with respect to the brackets 14 can be adjusted. Preferably, the device 50 is provided with a hood 60 at the upper end extending towards the brackets 14 and side plates 62 extending downwardly from the hood for helping to direct airflow towards the brackets. As shown best in FIG. 9, the side plates 62 are configured such that an edges 64 of the side plates 62 extend vertically and parallel with the panel 28. Although not shown, the distribution device 50, the hood 60, and the side plates 62 are preferably sized and positioned within the cabinet such that a substantially enclosed duct is formed between the distribution device 50 and the vertical array of servers.

Although the present inventions have been described and illustrated in detail, it is to be clearly understood that the same is by way of illustration and example only and is not to be taken by way of limitation, the scope of the present invention being limited only by the terms of the appended claims.

What is claimed is:

1. A system for removing heat from a plurality of electronic assemblies, comprising:

A. at least one cabinet including brackets for supporting electronic assemblies in a vertical array between a first vertical airflow path extending along a first side of the cabinet and a second vertical air flow path extending along a second side of the cabinet, the second side being opposite the first side of the cabinet, B. at least one plinth underlying the cabinet and having, an input port receiving warmed air from the first vertical airflow path of the cabinet, a output port transmitting cooled air from the plinth to the second vertical air flow path of the cabinet, at least one heat exchanger disposed along a plinth air flow path extending between the input and the output ports, and transferring heat from air passing along the plinth air flow path to a cooling heat exchange medium passing through the heat exchanger, and at least one fan assembly disposed along the plinth air flow path for driving air through the heat exchanger, the output port, along the second air flow path of the cabinet, across the spaced apart electronic assemblies, along the first air flow path of the cabinet, through the input port; and C. at least one air flow distribution device for establishing a predetermined flow rate distribution through electronic assemblies supported on the brackets of the cabinet.

2. A system according to claim 1, wherein the predetermined flow rate distribution is substantially the same.

3. A system according to claim 1, wherein the distribution device is positioned between the second vertical air flow path of the cabinet and the brackets.

4. A system according to claim 1, wherein the distribution device is substantially planar and extends vertically, and includes a plurality of apertures in a predetermined pattern of sizes and positions.

5. A system according to claim 4, wherein the distribution device is positioned between the second air flow path of the cabinet and the brackets, and the apertures of the distribution device at different distances from the plinth are sized and positioned so that the predetermined flow rate distribution is substantially the same.

6. A system according to claim 4, wherein the apertures of the distribution device are provided in horizontal rows.

7. A system according to claim 6, wherein the horizontal rows of the distribution device closest to the plinth include fewer apertures than the horizontal rows furthest from the plinth.

8. A system for removing heat from a plurality of electronic assemblies, comprising:
   A. at least one cabinet including brackets for supporting electronic assemblies in a vertical array between a first vertical airflow path extending along a first side of the cabinet and a second vertical air flow path extending along a second side of the cabinet, the second side being opposite the first side of the cabinet,
   B. at least one plinth underlying the cabinet and having, an input port receiving air from the first vertical airflow path of the cabinet, an output port transmitting air from the plinth to the second vertical air flow path of the cabinet, at least one heat exchanger disposed along a plinth air flow path extending between the input and the output ports, and transferring heat from air passing along the plinth air flow path to a heat exchange medium passing through the heat exchanger, and at least one fan assembly disposed along the plinth air flow path for driving air through the heat exchanger, the output port, along the second air flow path of the cabinet, across the spaced apart electronic assemblies, along the first air flow path of the cabinet, through the input port; and
   C. at least one air flow distribution device for establishing a predetermined flow rate distribution through electronic assemblies supported on the brackets of the cabinet; and
      wherein the distribution device is substantially planar and extends vertically, and includes a plurality of apertures in a predetermined pattern of sizes and positions; and
      wherein the apertures of the distribution device are equally sized.

9. A system according to claim 1, wherein the distribution device extends vertically and laterally between a lower end nearer the plinth and an upper end further from the plinth, such that the upper end of the distribution device is closer to the brackets than the lower end.

10. A system according to claim 9, wherein the distribution device is positioned in the second air flow path of the cabinet and is shaped and oriented so that the predetermined flow rate distribution through electronic assemblies supported on the brackets of the cabinet is substantially the same.

11. A system according to claim 9, wherein the distribution device is planar.

12. A system according to claim 9, wherein the distribution device includes a hood at the upper end extending towards the brackets.

13. A system according to claim 12, wherein the distribution device includes side plates extending from sides of the distribution device towards the brackets and extending between the hood and the lower end of the distribution device.

14. A system according to claim 1, comprising one cabinet and one plinth.

15. A system according to claim 1, wherein the plinth includes at least two of the fan assemblies and at least two of the heat exchangers.

16. A substantially enclosed cabinet for supporting electronic assemblies to be cooled and for being received on a plinth having an input port, an output port, and a plinth airflow path extending between the input and the output ports, the cabinet comprising:
   a base for placement on the plinth;
   a top panel spaced from the base;
   a first vertical airflow path vertically extending from the top panel to an outlet in the base for connection to the inlet port of the plinth;
   a second vertical airflow path vertically extending from an inlet in the base for connection to the outlet port of the plinth to the top panel;
   brackets for supporting electronic assemblies in a vertical array between the first and the second vertical airflow paths; and
   at least one substantially planar, vertically extending airflow distribution device having a plurality of apertures in a predetermined pattern of sizes and positions for establishing a predetermined flow rate distribution of cooled air from the inlet in the base through electronic assemblies supported on the brackets, wherein the combined area of the apertures of the airflow distribution device decreases in a direction extending between the base and the top panel of the cabinet.

17. A cabinet according to claim 16, wherein the distribution device is adapted to cause the predetermined flow rate distribution to be substantially the same.

18. A cabinet according to claim 16, wherein the distribution device is positioned between the second vertical airflow path and the brackets.

19. A cabinet according to claim 16, wherein the apertures of the distribution device are provided in horizontal rows corresponding to the brackets.

20. A cabinet for supporting electronic assemblies and for being received on a plinth having an input port, an output port, a plinth airflow path extending between the input and the output ports and a fan assembly positioned within the plinth airflow path, the cabinet comprising:
   a first vertical airflow path for connection to the inlet port of the plinth;
   a second vertical airflow path for connection to the outlet port of the plinth;
   brackets for supporting electronic assemblies in a vertical array between the first and the second vertical airflow paths; and
   at least one substantially planar, vertically extending airflow distribution device having a plurality of apertures in a predetermined pattern of sizes and positions for establishing a predetermined flow rate distribution through electronic assemblies supported on the brackets, wherein the apertures of the distribution device are equally sized and are provided in horizontal rows corresponding to the brackets, wherein the number of apertures in the rows varies.

21. A plinth for supporting and cooling at least one cabinet including a first vertical airflow path, a second vertical air flow path, a base defining an outlet for the first vertical airflow path and an inlet for the second vertical air flow path, and brackets for supporting electronic assemblies in a vertical array between the first vertical airflow path and the second vertical air flow path, the plinth comprising:

an input port for receiving warmed air from the outlet of the cabinet;

an output port for transmitting cooled air from the plinth to the inlet port of the cabinet;

a plinth air flow path extending between the input and the output ports;

at least one heat exchanger disposed along the plinth air flow path for containing a cooling heat exchange medium; and at least one fan assembly disposed along the plinth air flow path for driving air from the input port through the heat exchanger towards the output port.

22. A plinth according to claim 21 wherein the plinth is sized to support and cool a single cabinet.

23. A plinth according to claim 1, wherein the plinth includes at least two of the fan assemblies.

24. A plinth according to claim 1, wherein the plinth includes at least two of the heat exchangers.

25. A cabinet according to claim 20, wherein the number of the apertures in each of the horizontal rows decrease in a direction extending between the base and the top panel of the cabinet.

* * * * *